United States Patent [19]

Scrutton et al.

[11] Patent Number: 5,147,489

[45] Date of Patent: Sep. 15, 1992

[54] COLOURED IMAGES

[75] Inventors: Simon L. Scrutton, Iden; John V. Shepherd, Wye, both of England

[73] Assignee: Esselte Pendaflex Corporation, Garden City, N.Y.

[21] Appl. No.: 427,177

[22] Filed: Oct. 25, 1989

[30] Foreign Application Priority Data

Nov. 2, 1988 [GB] United Kingdom ............... 8825648

[51] Int. Cl.⁵ ............................................. B32B 31/00
[52] U.S. Cl. .................................... 156/235; 156/239; 156/240
[58] Field of Search ............... 156/235, 239, 240, 234; 430/42

[56] References Cited

U.S. PATENT DOCUMENTS

| | | | |
|---|---|---|---|
| 4,006,267 | 2/1977 | Kurz et al. | 427/56.1 X |
| 4,600,669 | 7/1986 | Ng et al. | 430/42 X |
| 4,725,867 | 2/1988 | Ng et al. | 355/67 X |
| 4,822,643 | 4/1989 | Chou et al. | 156/234 X |
| 4,923,848 | 5/1990 | Akada et al. | 427/256 X |

Primary Examiner—David A. Simmons
Assistant Examiner—James J. Engel, Jr.
Attorney, Agent, or Firm—Darby & Darby

[57] ABSTRACT

Multi-colored images are built-up from thermoplastic, separation negatives obtained for example on a laser printer. Colored positive separations are obtained by applying a colored, transferable non-thermoplastic layer on a carrier over each thermoplastic negative separation, subjecting the assembly to heat and pressure, and peeling apart the assembly whereby colored non-thermoplastic positive images remain on the carrier sheet. Each colored non-thermoplastic positive separation in turn is then transferred to a receptor having a thermoplastic surface. Each colored, non-thermoplastic positive is applied over the receptor having a thermoplastic surface, the image being in contact with the thermoplastic surface, the assembly is subjected to heat and pressure and the carrier sheet removed to leave the positive image adhered to the thermoplastic surface of the receptor. This process is repeated for each color positive separation to build up the multi-colored image on the receptor surface.

11 Claims, 1 Drawing Sheet

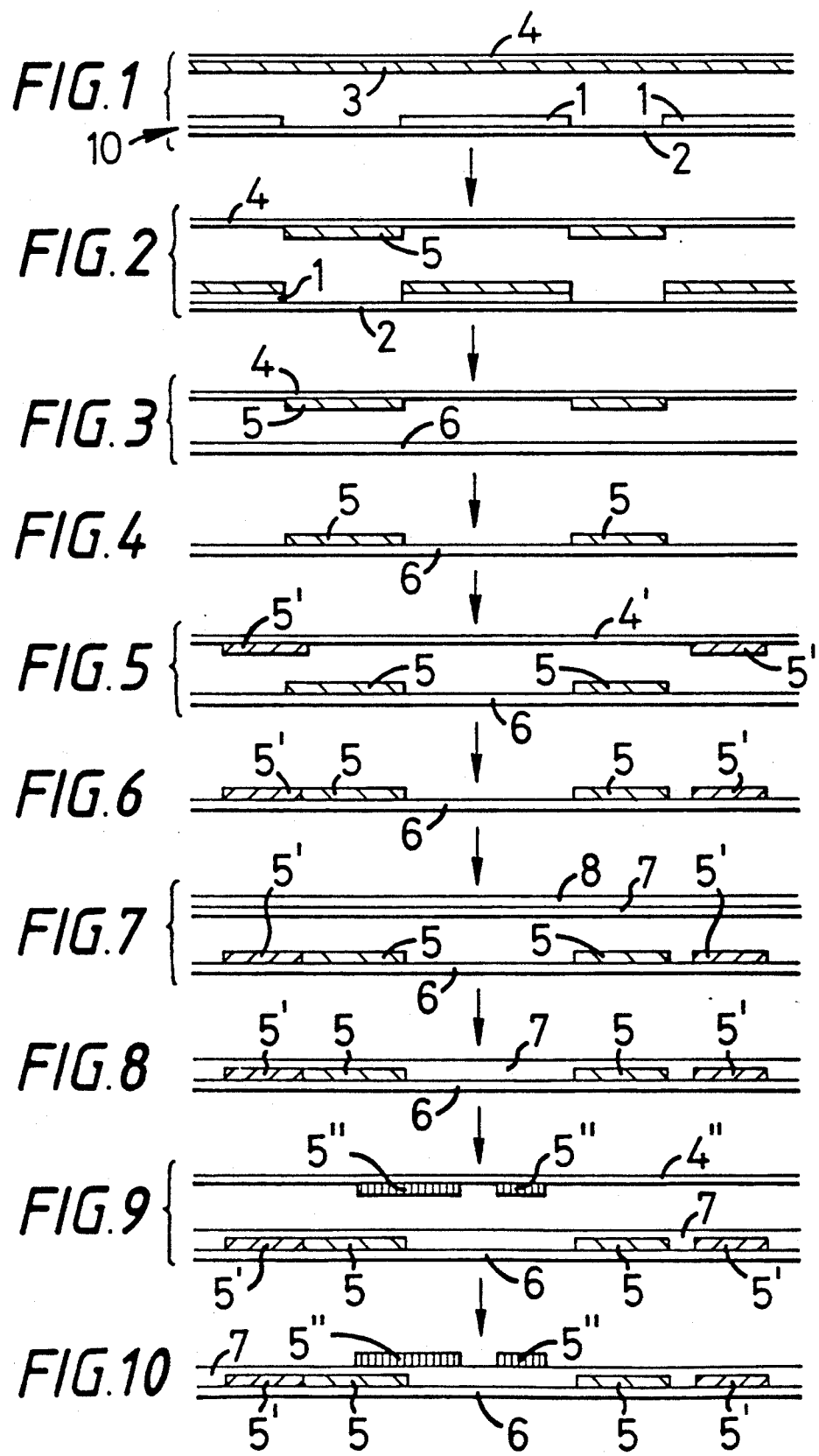

COLOURED IMAGES

This invention relates to the building up of coloured images, especially from single colour, generally black, thermoplastic images, on a carrier, e.g. paper, sheet, and the coloured images obtained thereby.

Multi-coloured images may be built up by sequential application of each colour component separately to the required receiver surface. This technique is well known and is used for example in colour printing. It is often desired to produce good quality multi-coloured images in uncomplicated and non-time consuming manner, as for example where the images are required singly or only in small numbers.

The provision of thermoplastic images on a carrier, e.g. paper, is well-known. They may be obtained by printing, e.g. screen printing, onto the carrier using a thermoplastic ink. Thermoplastic images are also obtained by electrophotographic reproduction. In electrophotography, the final image is generally formed by heat fixing of a thermoplastic toner image onto the carrier sheet. The provision of coloured thermoplastic images by these processes is known, e.g. using coloured thermoplastic printing ink or using electrophotographic colour reproduction processes, but commonly the thermoplastic images are obtained in the form of a single colour, generally black, on a white carrier. Also more recently, thermoplastic images are obtained using laser printers, where, as in electrophotography, a thermoplastic toner image is heat fixed onto a carrier. Again, these are commonly single colour, black, images on white.

It is known to colour thermoplastic images by selectively adhering thereto coloured coating layers. U.S. Pat. No. 4,053,344 describes a decoration method to provide a metallic appearance where an adhesive-coated metal stamping foil is applied over a printed image surface and the whole is heated whereby the foil adheres selectively to the printed image areas. After removal of the unadhered stamping foil, there remains an image surface having a metallic appearance decoration.

EP-A-0191592 describes a process for the selective transfer of metallic foil to a xerographic image on a receiving substrate such as paper. A xerographic image-bearing receiving substrate and a metallic foil are sandwiched together and heat and pressure applied such that the xerographic image becomes tacky and the metallic foil selectively adheres to, and thus decorates, the image areas.

U.S. Pat. No. 4,006,267, on the other hand, describes a method of selectively colouring black on white xerographic copies by applying a donor sheet having a colourant in a resin binder coated thereon to the image carrier. On the application of heat and pressure, the thermoplastic image is softened and adheres to this colourant layer. The colourant layer shears when the two sheets are pulled apart so that it remains adhered to the image in the image areas, and to the cover sheet outside the image areas. It will be appreciated that to obtain satisfactory colours, thick opaque colourant layers are necessary satisfactorily to hide the black toner therebeneath.

Multicoloured images may be produced by the above processes if the metallic foils/colourant-containing donor sheets are cut into small pieces and used to cover selected areas of the thermoplastic image before applying heat and pressure. This method is not suitable where two or more areas of colour butt together or where colours are intricately interlinked. More complicated two-coloured images can be produced by first colouring a positive toner image with a first colour by a method described above, which will leave a negative image on the colour sheet used in the transfer. This negative image is then transferred, by heat and pressure, onto a receptor sheet having a complete covering of thermoplastic toner. Finally this image-bearing receptor sheet is placed in contact with a colour sheet of a second colour so that under the action of heat and pressure, the second colour layer adheres to the thermoplastic toner showing through the negative image of the first colour. A two colour image can be made in this way because under normal transfer conditions, the second coloured layer will not adhere to the non-thermoplastic first. However the second colour will tend not to adhere to fine lines of toner showing through the first colour because the second colour sheet is held away from the toner by high caliper of the first colour; this high caliper being necessary to ensure adequate opacity over the thermoplastic toner behind. Another problem is that, when the first image is used to remove the first colour from its support sheet, there is often some residual colour material left behind, due again to the necessity of using thick layers, and this residual colour material transfers to the black receptor sheet and interferes with the transfer of the second colour.

The use of colour separation negatives or positives in the preparation of colour prints is well known. Increasingly computers are being used with suitable software to compose coloured artwork. This is created either on a coloured screen where the colours themselves are visible, or on a black and white screen where different shading patterns are usually used to represent the different colour areas. In preparation for producing colour prints the artwork is separated into its individual colour components. This is done with primary colours within the computer itself by a programme which either separates the colours of each pixel into its red, green and blue components for an additive process or into its cyan, yellow, magenta and optionally black components for a subtractive process. Alternatively the artwork may be separated into flat colour components that may be chosen to correspond to colour references in a standard colour matching system (e.g. PANTONE MATCHING SYSTEM).

Colour prints may be produced from red, green and blue separations in a film recorder where photographic colour film or paper is sequentially exposed to each of the three colour preparations, through appropriately coloured filters, to build up a latent image which is then developed by conventional means. For the subtractive process, colour prints may be produced from cyan, yellow, magenta and optionally black separations in colour non-impact printers such as thermal or ink-jet printers. Alternatively black and white separation positives or negatives for each colour, can be printed or set, and used as masters for conventional printing.

All of these methods of producing colour prints from computer images require expensive equipment which may cost many times that of the equipment used to create the coloured artwork in the first place.

A different approach to producing a colour print of what is being composed on a computer screen is to print, or set, colour separation negatives or positives and to use these to produce a print by a commercial proofing system. For example, in a direct imaging process, a photosensitive layer containing each selected colour in turn is coated on a support by hand using a wire wound bar, exposed to ultra violet light through the appropriate colour separation negative, treated with water to remove the unexposed material and dried. While this procedure can produce good results, at relatively low cost, it can also be complex, time consuming, and messy and requires considerable skill on the part of the operator to achieve these good results. Some other colour proofing systems are more automated but require more expensive equipment.

According to the present invention there is provided a method of building-up a multi-coloured image, which method comprises applying over a receptor having a thermoplastic surface, a first coloured, non-thermoplastic positive image on a carrier sheet; the image being in contact with the thermoplastic surface; subjecting the assembly to heat and pressure; and removing the carrier sheet to leave the first coloured positive image adhered to the thermoplastic surface of the receptor;

optionally applying a layer of transparent or translucent thermoplastic material over at least the first image areas on the receptor sheet, and applying over the first image-bearing receptor, a second coloured, non-thermoplastic, positive image carried on a carrier sheet, whereby the second image is in contact with the thermoplastic surface and/or applied thermoplastic layer, subjecting the assembly so formed to heat and pressure, and removing the carrier sheet to leave second coloured positive image areas adhered to the thermoplastic surface and/or applied thermoplastic layer on the receptor;

each coloured non-thermoplastic positive image on a carrier sheet having been obtained by applying a coloured, transferable non-thermoplastic layer on the carrier over a thermoplastic negative image, subjecting the assembly to heat and pressure, and peeling apart the assembly whereby coloured non-thermoplastic layer material adheres to the thermoplastic negative to leave a coloured non-thermoplastic positive image on the carrier sheet.

Further coloured non-thermoplastic positive images may be transferred to the thermoplastic surface from other carrier sheets according to the desired colours of the final built-up image. For example, in a subtractive process, three or optionally four, cyan, yellow, magenta and optionally black, coloured non-thermoplastic images will be applied. The method according to the invention may thus additionally comprise optionally applying a layer of transparent or translucent thermoplastic material over at least the first or second image areas on the receptor sheet, and applying over the second image-bearing receptor, a third coloured, non-thermoplastic, positive image carried on a carrier sheet, whereby the third coloured image is in contact with the thermoplastic surface and/or applied thermoplastic layer material on the receptor.

The coloured non-thermoplastic positive images are transferred to the thermoplastic surface or applied thermoplastic layer(s) of the receptor by a thermal transfer process under the influence of the heat and pressure step. The thermoplastic surface material is softened and caused to adhere to the non-thermoplastic image such that, on removal of the carrier sheet, the image remains adhering to the thermoplastic material. It is to be understood that the terms "thermoplastic" and "non-thermoplastic" refer to the behaviour of the layers at the transfer temperatures used. At low temperatures, the "thermoplastic" materials may not perhaps display thermoplastic properties and at higher temperatures the "non-thermoplastic" materials may become thermoplastic.

Because the positive images are themselves non-thermoplastic, they will not adhere directly to each other. Thus the second or any subsequent image will not adhere directly to the first or any other previously applied image areas. This means that either the images areas to be applied directly one over the other are non-overlapping, or, if they are overlapping, that the second or subsequent image areas will only transfer to the thermoplastic surface in those areas not overlapping with the first and any other previously applied positive image, those parts of the second positive image which do overlap with the first (and previously applied) positive image being retained on the carrier sheet after the thermal transfer step. This latter effect is particularly useful in facilitating the obtaining of abutting colours in the final coloured image. Undesired overlap, causing a change in colour in the overlapping area, is avoided, making the registration and the alignment of the colour separations less critical. Since in this embodiment the subsequent images will not adhere directly to the previously applied images, no overlap in the final image will occur where there might be a slight misregistration in printing.

Of course there are some instances in which it is desired to have image areas overlapping. This is particularly the case in the subtractive process where overlapping is necessary to ensure that the correct colour develops. This may be achieved according to the present invention by applying a transparent or translucent, (generally colourless) thermoplastic layer over the first (or previously applied) positive image on the thermoplastic surface before the thermal transfer of the second (or subsequent) coloured positive image thereto.

The coloured non-thermoplastic positive images carried on carrier sheets used according to the present invention are preferably positive colour separations. These are conveniently obtained using colour separation negative prints as the starting thermoplastic negative images on a carrier such as paper. Thus the colour composition it is desired to reproduce is separated into its component colours and each is printed, e.g. using a laser printer, in thermoplastic toner on a support, such as paper, to provide a set of colour separation negatives. Simple black on white separations can be produced from many computer paint programmes by suitable manipulation. For example using Ann Arbor Softworks Inc.'s Full Paint programme, positive separations can be obtained and inverted to negative form by using e.g. Full Paint programme's Invert command. Some software, such as Laserware, Inc.'s LaserPaint programme, provide separations in various forms automatically and therefore with much greater convenience. The separations are then printed out using a laser printer in the form of thermoplastic toner on a paper carrier.

The coloured non-thermoplastic positives are obtained by placing the thermoplastic negative image into contact with a coloured transferable non-thermoplastic layer on a carrier sheet. The transferable material layer may for example comprise a colourant in a binder or a metallic foil layer. Under the action of heat and pressure, the negative toner image softens and adheres to the coloured layer material. When the carrier and print are separated, in the negative areas, the transferable coloured layer has been transferred to the thermoplastic toner to leave on the carrier sheet a positive coloured non-thermoplastic image. This process can be repeated for each colour separation to provide a set of non-thermoplastic positive colour separation images.

Naturally it is important according to the present invention that there is proper registration of the component image parts as the image is built up on the thermoplastic base surface. This may conveniently be achieved by the provision, in the original colour separation negative prints of registration marks. Thus as long as the marks are appropriately registered as each subsequent image is applied, the final built up image should be in register. A pin registration system may also be used.

The following are examples of methods of building up multi-coloured positive images using computer generated colour separation thermoplastic negative prints according to the invention:

1. A first negative separation print, including appropriate registration marks, obtained as a toner image from a laser printer, is placed in face-to-face contact with a transparent or translucent carrier sheet coated with a coloured transferable layer comprising a first colourant dispersed in a non-thermoplastic binder or a metallic foil layer. Under the action of heat and pressure, the toner of the negative print image softens and adheres to the coloured layer material. When the print and carrier sheet are separated, the negative print areas have adhered thereto coloured layer material from the carrier sheet to provide a negative colour image of the first separation print (this sheet is no longer required) and a non-thermoplastic positive colour image remains on the transparent or translucent carrier sheet.

A receptor sheet coated with a, preferably substantially white or colourless, thermoplastic surface, is placed in face-to-face contact with this first positive colour image on its carrier sheet and heat and pressure are applied so that the thermoplastic material softens and adheres to the positive image. On peeling apart of the carrier sheet and receptor sheet, the first positive colour image remains adhered to the receptor sheet (complete with registration marks).

The second colour negative separation print, including appropriate registration marks, also obtained as a toner laser image, is placed in face-to-face contact with a second transparent or translucent carrier sheet coated with a coloured layer comprising a second colourant dispersed in a non-thermoplastic binder or a second metallic foil layer. Under the action of heat and pressure, the toner softens and adheres to the second coloured layer material. When the print and carrier sheets are separated, the coloured layer material remains adhering to the negative print to give a negative colour image (this sheet is no longer required) and a non-thermoplastic positive colour image remains on the carrier sheet.

The receptor sheet, complete with first non-thermoplastic colour positive image adherent to the thermoplastic layer, is placed in face-to-face contact with the second non-thermoplastic positive colour image, registration being achieved by aligning the registration marks of both images. Under the action of heat and pressure, the thermoplastic layer softens and adheres to the second positive image. On peeling apart of the carrier and receptor sheets, both the first and second colour positive images remain adhered to the thermoplastic layer on the receptor sheet.

This process may be repeated with third, fourth, or even more colours building up the positive images in registration until the desired final multicolour composition is complete. This process assumes that the colour separations represent different areas of colour, i.e. there is overlap of image area of one separation with that of another.

2. In a second embodiment, the second or subsequent colour separation includes areas already imaged in the first (or a preceding) colour separation. This embodiment makes use of the fact that, as the coloured layers are non-thermoplastic, one colour will not adhere directly to another colour on application of heat and pressure. Thus where the second (or subsequent) colour image overlaps the first (or previously applied) on the thermoplastic base layer it will not transfer in the overlapping areas but provides butt registration.

A first non-thermoplastic positive colour image on a carrier sheet is prepared from a first negative colour separation and transferred to the thermoplastic layer of a receiver sheet as described above. A second colour separation positive image (which overlaps in area with the area of the first) is obtained by printing a separation negative in thermoplastic toner, placing in contact with a second carrier sheet carrying a second coloured layer and applying heat and pressure. The sheets are peeled apart and the coloured second negative image discarded.

The second positive image is placed in register with the first positive colour image on the thermoplastic surface of the receptor sheet and the assembly subjected to heat and pressure and subsequently the carrier sheet and receptor sheet are peeled apart. The second positive image will adhere to the receptor sheet in those areas where it is in contact with the thermoplastic layer on the receptor sheet. Where the second layer overlaps the non-thermoplastic first positive image areas, the second image will not adhere and thus will not transfer. At the edges of the two colour areas, the two colours will butt together in register.

Further colour images can be transferred to the thermoplastic layer on the receptor sheet and in each case, where there is overlap, the colours will butt up against previously transfer colours but will not cover them.

This embodiment means that simplified procedures in the making of the coloured negatives may be employed as they do not have to be as detailed as those required for full colour separations. The procedures make accurate registration less critical. However negatives of this type are not generally suitable in conventional flat colour printing as in the printing process, the second colour will print over the first, and that area will change its colour. For conventional colour printing, it is necessary to make the fully separated negatives described in method 1 above. Sometimes for flat colour printing it is desired to make one colour separation overlap slightly with another so that if there is a slight misregistration in printing, this will not be an unsightly wide gap. Overlapping separations of this type can be used in the present invention and also help to avoid any white gap caused be misregistration. The overlapping colour should of course be that applied second so that the overlap does not print and the second colour just butts to the first. Similarly considerations will of course apply to further colours in the same way.

3. This embodiment of the invention is concerned with the cases where the second (or subsequent) colour separation includes areas already imaged in the first (or previous) colour separation and where overlapping of the transferred image is desired. This embodiment is useful in particular with screened three or four colour subtractive separations. In conventional process colour printing, the subtractive process colours cyan, yellow and magenta are required to overprint on top of each other. For example if a cyan dot is printed so that it overlaps, or partially overlaps a magenta dot, the magenta dot will show through the cyan to develop the correct colour. If the cyan dot of this example is not fully printed and does not overlap the magenta dot (as would occur according to embodiment 2 above), it will not develop its full colour.

According to this third embodiment of this present invention, before application of the second (or subsequent) overlapping image to the receptor sheet carrying the first (or preceding) colour image, there is applied over the receptor sheet, at least in the first (or previous) image area(s), a layer of transparent or translucent thermoplastic material. In this way a complete thermoplastic surface layer is presented to the second (or subsequent) coloured non-thermoplastic positive image and thus the whole of the image area can be transferred in the thermal transfer step. While theoretically it is possible just to cover those previous image areas with which the second (or subsequent) image is likely to overlap with thermoplastic material, it is generally more convenient simply to provide another complete thermoplastic layer over the entire receptor. This may be achieved by a coating method or by a transfer method whereby a thin transparent or translucent thermoplastic layer is transferred from a carrier sheet to the receptor sheet under the influence of heat and pressure.

According to this third embodiment, a first colour negative screen image separation may be printed in thermoplastic toner. The image is placed in contact with first coloured layer on a first carrier sheet, heat and pressure applied, the sheets peeled apart and the negative image discarded. The non-thermoplastic positive image in the first colour remaining on the first carrier sheet is transferred by heat and pressure to a thermoplastic coated receiver sheet.

A release sheet coated with a thin layer of colourless thermoplastic material is then placed in face-to-face contact with the receptor sheet carrying the first colour image and, under the action of heat and pressure, the thermoplastic layer is transferred from the release coated sheet to the receptor sheet.

A second colour negative screen image separation is printed in thermoplastic toner. This second negative image is placed in contact with a second colour non-thermoplastic layer on a carrier, heat and pressure are applied, the sheets peeled apart and the negative image discarded. The non-thermoplastic positive image in the second colour remaining on the second carrier sheet is placed in register with the image of the first colour image on the receptor sheet and transferred by heat and pressure to the receptor sheet. The second colour transfers over areas already covered by the first colour, because the first colour is itself covered by the transferred colourless thermoplastic layer.

Another colourless thermoplastic layer can be transferred in a similar way to the receptor sheet covering the second image before transferring a third colour positive image and similarly again before transferring a fourth positive colour image. In this way a four colour image can be built up with each colour complete, even if it overlays a previous colour.

It will be appreciated that the method of the present invention thus provides a quick, simple and dry method of producing a multicoloured image from colour separated art work which requires only relatively inexpensive equipment. The method also has the particular advantage that the layers of colour on the transfer sheet can be quite thin because they do not require the opacity to hide a black toner layer. Indeed preferably according to the present invention, they are transferred to form clean images on a receptor sheet providing a white background. The coloured layers can be formulated to give better resolution and less background contamination than thicker more opaque layers used in direct covering of toner images. Moreover because the colours do not have to be opaque, it is also possible to formulate transparent layers that match the subtractive process colours and also to formulate colours that match colour matching systems.

We have in the above discussed mainly the use of additive and subtractive processes in the production of coloured images and the use therein of coloured layers comprising colourant dispersed in a non-thermoplastic binder. This is seen as the principal application of the present invention. However methods may be used to provide other multicolour images by thermal transfer and indeed to provide metallic images by using in place of a colourant/binder layer, a metallic layer on a suitable carrier sheet.

The colouring material comprising a carrier sheet and a coloured layer thereon may for example be one of those described in EP-A-0191592 and U.S. Pat. No. 4,006,267. The coloured layer needs to be one which under the conditions of heat and pressure applied, adheres to the thermoplastic toner but not to the surrounding areas.

The carrier sheet must of course be one which is itself stable under the transfer conditions and one which is preferably transparent or translucent to facilitate registering of the positive image for the transfer step to the receptor sheet. This carrier sheet is suitably a thin plastics film, e.g. polyester such as polyethylene terephthalate, which may be release coated. The film is preferably thin enough to allow rapid heat transfer but not so thin as to result in wrinkling in use. Generally a film thickness of approximately 12 microns is preferred. The carrier sheet is preferably transparent or translucent if visual registration is being used, but may be opaque if a pin register system is being employed to ensure accurate alignment of the images.

The receptor sheet must of course have a thermoplastic surface to ensure proper transfer of the non-thermoplastic positive images to it. The receptor sheet may be of thermoplastic material. Preferably, however, it comprises a substrate sheet having a thermoplastic coating. The substrate of the receptor sheet may be of plastics or paper, flexible or rigid, and transparent or opaque. Preferably it is a filled white flexible plastics or plastics coated paper. The thermoplastic coating may have a light colour but, as mentioned above, is prefereably white or transparent according to the desired end effect. Suitable thermoplastics coatings for the receptor sheet include polyvinyl acetate copolymer, styrene butadiene copolymer.

The heat and pressure of the transfer steps can be applied by any suitable means e.g. heated nip, heated roller, heated plate (iron). Naturally, particularly in the transfer to the thermoplastics receptor sheet, it is important to maintain registration during the heat transfer step. In the case of visual registration, this can conveniently be achieved by using a sandwich type construction similar to that shown in EP-A-0191592.

Thus a carrier with coloured layer may be fixed along one edge to a backing sheet, usually made of paper, so that the sheet carrying the thermoplastic image or the receptor sheet is placed and held firmly in this sandwich for transfer of the colourant. A pair of motor driven rollers applying heat and pressure in the nip may be used where visual registration is employed. A heated hand roller or flat heat press (iron) is generally more convenient where pin registration is employed.

The invention is further illustrated, by the way of example, with reference to FIGS. 1 to 10 of the accompanying drawings which illustrate diagramatically a method of building up a multi-coloured image incorporating aspects from all three of the above embodiments.

Referring to FIG. 1, a first negative separation print 10 comprising thermoplastic toner image areas 1 on a paper support 2 is brought into contact with a coloured, transferrable non-thermoplastic layer 3 (of a first colour) on a carrier 4. This assembly is subjected to heat and pressure, allowed to cool and then peeled apart.

As shown in FIG. 2, on peeling apart, in the image areas, the coloured transferrable non-thermoplastic material of layer 3 is pulled off from the carrier 4 by the toner (thermoplastic) image areas 1. In the non-image areas however the coloured transferrable non-thermoplastic material of layer 3 remains on the carrier 4. Thus there is provided a first coloured, non-thermoplastic positive image 5 on the carrier 4. [The coloured negative print on paper support 2 with toner image areas 1 is discarded.]

Then, as shown in FIG. 3, the first coloured, non-thermoplastic positive image 5 on carrier 4 is applied to a thermoplastic surface 6. This assembly is subjected to heat and pressure, e.g. by being passed through the nip of a heated roller, the assembly is allowed to cool and the carrier 4 is removed to leave the first coloured non-thermoplastic positive image 5 adhered to the thermoplastic surface 6 as illustrated in FIG. 4.

A second coloured non-thermoplastic positive image is applied to the first coloured positive image on the thermoplastic surface 6 of FIG. 4 as follows:

Referring to FIG. 5 there is applied, over the first coloured, non-thermoplastic positive image 5 on the thermoplastic surface 6, a non-thermoplastic second positive image of a second colour 5' on a carrier 4' (obtained in analogous manner to the first coloured non-thermoplastic positive image 5 on carrier 4 using a second negative separation print).

The assembly of FIG. 5 is subjected to heat and pressure and then, after cooling, the second carrier 4' is peeled off. In those areas in which the second coloured non-thermoplastic positive image 5' has contacted the thermoplastic surface 6, after peeling apart, the areas remain adherent to the thermoplastic surface 6. In those areas where the second coloured non-thermoplastic positive image 5' overlaps with the first non-thermoplastic positive image 5 (as illustrated to the left of FIG. 5), the overlapping part of the non-thermoplastic image 5' is unable to adhere to that part of the non-thermoplastic image 5 with which it overlaps. Thus that overlapping part of image 5' is removed with second carrier 4'.

Accordingly, as shown in FIG. 6, there is provided a two coloured image in which the thermoplastic surface 6 has adhered to it non-overlapping first coloured non-thermoplastic image areas 5 and second coloured non-thermoplastic image areas 5'. In the areas of previous overlap, the two image area materials abut with part of area 5' not having transferred.

A third coloured non-thermoplastic positive image is applied over the first and second coloured positive images on the thermoplastic surface 6 of FIG. 6 as follows:

As illustrated in FIG. 7, there may be first provided over the whole of the image bearing surface of the product shown in FIG. 6 a transparent thermoplastic layer. Thus a transferrable thermoplastic transparent layer 7 on a substrate backing sheet 8 is applied over the image bearing surface of the thermoplastic surface 6 and the assembly subjected to heat and pressure. The assembly is cooled and the substrate backing sheet 8 is removed to leave, as illustrated in FIG. 8, an overlayer of thermoplastic transparent material 7 over the image areas 5' and 5 as well as the intervening surface 6. In this way there is provided a thermoplastic surface over the entire material including, in particular, the previously non-thermoplastic surfaces of image areas 5 and 5'.

Referring to FIG. 9 a non-thermoplastic third positive image 5" in a third colour on a third carrier 4" (obtained in analogous fashion to the first coloured non-thermoplastic positive image 5 on carrier 4 using a third negative separation print) is brought into contact with the surface of thermoplastic transparent coating 7 over image areas 5' and 5 on surface 6. As before this assembly is subjected to heat and pressure allowed to cool and carrier 4" is then removed.

Then, as shown in FIG. 10, the third coloured image areas 5" are transferred to the image bearing surface to provide a tri-coloured image. In this case, even where there is overlap with the previous image areas, in particular, as shown, between image area 5 and 5", the whole of image area 5" transfers due to the presence of the overlying thermoplastic coating 7 enabling there to be image overlap.

Of course it has to be appreciated that FIGS. 1 to 10 are not to scale and for clarity the materials are shown with a separation even when the materials are brought together as an assembly and subjected to heat and pressure. Also the process is subject to variation in particular concerning the use of a thermoplastic transparent layer 7. This may be for example omitted in entirety in which case, in the transfer of FIG. 9, the transfer will only take place on to surface 6 in the areas in which image areas 5" are non-overlapping with image areas 5 and 5'. Also a thermoplastic layer may be applied to thermoplastic surface 6 bearing image areas 5 before application of image areas 5' in FIG. 5. In this case the entire image areas 5' will transfer and not just the non-overlapping portions as illustrated.

The invention is further illustrated in the following Examples:

EXAMPLE 1

A receptor sheet was prepared by coating on to a filled polyethylene terephthalate (Melinex type 226 ex; ICI) a polyvinyl acetate copolymer emulsion (Mowilith 130 ex Harco) using a 20 bar. The coating was dried using a current of air at approximately 60° C.

A photocopy comprising a heat fused toner image from a UBIX 550Z photocopier (ex Konica), obtained in the conventional way, was placed with the image in contact with a metallic foil on polyester carrier sheet (GRT 800 ex Omnicrom) and the assembly thus obtained was fed into the nip of an Omnicrom CT 500 heat laminator with the rollers at their equilibrium temperature of approximately 144° C. and a running speed of 2.4 m/min. The assembly was then allowed to cool and the carrier sheet and photocopy separated to leave the metallic foil adhering to the image areas of the photocopy and in the non-image areas, the metallic foil remaining adhering to the carrier sheet.

The metallic foil remaining on the carrier sheet was brought into contact with the polyvinyl acetate copolymer coated surface of the polyethylene terephthalate film. This assembly was passed through the heat nip of the Omnicron CT 500 heat laminating apparatus operating at the same temperature and speed as before. The assembly was allowed to cool and the polyethylene terephthalate film and the carrier sheet were separated. The metallic foil image had transferred from the carrier sheet to the coated polyethylene terephthlate film.

A second metallic foil on a polyester carrier (RET 300 ex Omnicrom) was placed in contact with a second photocopy from the UBIX photocopier and the assembly passed through the heated nip of the Omnicron CT 500 heat laminator under conditions as before. The metallic foil adhered to the image areas of the photocopy and, on peeling apart of the photocopy and the metallic sheet, in the non-image areas remain adhering to, to provide a positive image on, the carrier sheet.

This positive image was then placed over the first image on the coated polyethylene terephthalate and again the assembly passed through the heated nip of the Omnicron CT 500 heat laminator under the same conditions. The metallic foil transferred from the carrier sheet to the coated polyethylene terephthalate only in those areas not coinciding with the first image areas.

EXAMPLE 2

Example 1 was repeated using as receptor sheet a sheet obtained by coating a 20% by weight solution of styrene butadiene copolymer (Pliolite S5B ex Goodyear Chemicals) in toluene on to coated filled polyester paper (Letrachrome "plastic paper" ex Esselte Letraset) using a 20 bar and drying.

Similar results to Example 1 were obtained using the foil described in Example 1.

EXAMPLE 3

Example 1 was repeated using as receptor sheet a sheet obtained by coating a 30% by weight solution of acrylic resin in ethyl cellusolve (Paraloid A 10 ex Rohm and Haas) on to coated filled polyester paper (Letrachrome "plastic paper" ex Esselte Letraset) using a 20 bar and drying. Similar results to Example 1 were obtained using the foil described in Example 1.

We claim:

1. A method of building-up a multi-colored image, which method comprises:

(1) preparing a colored, non-thermoplastic positive image on a carrier, by applying a carrier bearing a colored, transferable non-thermoplastic layer over a thermoplastic negative image, subjecting the carrier and image assembly to non-imagewise heat and pressure, and peeling apart the assembly, whereby the colored non-thermoplastic layer material adheres to the thermoplastic negative image to leave a colored non-thermoplastic positive image on the carrier;

(2) applying said carrier bearing the colored, non-thermoplastic positive image over a receptor having a thermoplastic surface, the image being in contact with the thermoplastic surface;

(3) subjecting the carrier and receptor assembly to non-imagewise heat and pressure and removing the carrier to leave the colored positive image adhered to the thermoplastic surface of the receptor; and (4) repeating step (1) using at least a second color and positive image, applying the second colored non-thermoplastic positive image on the carrier so obtained to the thermoplastic surface of the receptor obtained in step (3), and subjecting the assembly of the second carrier and the receptor to non-imagewise heat and pressure and removing the carrier to leave the second colored positive image adhered to the thermoplastic surface of the receptor.

2. A method according to claim 1 wherein the thermoplastic negative image is a black thermoplastic toner image.

3. A method according to claim 1, which further comprises applying a layer of transparent or translucent thermoplastic material over at least the colored positive image adhered to the thermoplastic surface of the receptor.

4. A method according to claim 3, wherein at least one colored positive image is applied over the transparent or translucent thermoplastic material.

5. A method according to claim 4, wherein at least three successive colored positive images are applied to the thermoplastic surface of said receptor.

6. A method according to claim 5 wherein the thermoplastic negative image is a black thermoplastic toner image.

7. A method according to claim 5 wherein each thermoplastic negative image is a colour separation negative.

8. A method according to claim 7 wherein the colour separation negatives have been produced on a laser printer.

9. A method according to claim 1, wherein at least three successive colored positive images are applied to the thermoplastic surface of said receptor.

10. A method according to claim 3 wherein each thermoplastic negative image is a colour separation negative.

11. A method according to claim 10 wherein the colour separation negatives have been produced on a laser printer.

* * * * *